(12) United States Patent
Huang

(10) Patent No.: US 12,400,955 B2
(45) Date of Patent: Aug. 26, 2025

(54) SEMICONDUCTOR DEVICE WITH POROUS DIELECTRIC LAYERS AND METHOD FOR FABRICATING THE SAME

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 57 days.

(21) Appl. No.: 18/197,816

(22) Filed: May 16, 2023

(65) Prior Publication Data
US 2024/0030133 A1 Jan. 25, 2024

Related U.S. Application Data

(62) Division of application No. 17/870,087, filed on Jul. 21, 2022.

(51) Int. Cl.
*H01L 23/528* (2006.01)
*H01L 21/768* (2006.01)
*H01L 23/532* (2006.01)

(52) U.S. Cl.
CPC ...... *H01L 23/528* (2013.01); *H01L 21/76837* (2013.01); *H01L 21/76841* (2013.01); *H01L 21/76885* (2013.01); *H01L 23/5329* (2013.01)

(58) Field of Classification Search
CPC ............... H01L 23/528; H01L 23/5329; H01L 23/53295; H01L 23/5225; H01L 21/76837; H01L 21/76841; H01L 21/76885; H01L 21/76832; H01L 21/76834; H01L 21/76831; H01L 21/76801
See application file for complete search history.

(56) References Cited

U.S. PATENT DOCUMENTS

| | | | |
|---|---|---|---|
| 2017/0162576 A1* | 6/2017 | Kim | H01L 21/823814 |
| 2017/0345712 A1* | 11/2017 | Min | H01L 29/66545 |
| 2020/0035486 A1* | 1/2020 | Venkatasubramanian | H01L 21/0217 |
| 2021/0098264 A1 | 4/2021 | Huang et al. | |
| 2024/0030133 A1* | 1/2024 | Huang | H01L 23/528 |

FOREIGN PATENT DOCUMENTS

| | | |
|---|---|---|
| TW | 201419445 A | 5/2014 |
| TW | 202228261 A | 7/2022 |

OTHER PUBLICATIONS

Office Action mailed on May 24, 2023 related to Taiwanese Application No. 112101412.
Notice of Allowance dated Jun. 16, 2023 Related to Taiwanese Application No. 112101412.

\* cited by examiner

*Primary Examiner* — Galina G Yushina
(74) *Attorney, Agent, or Firm* — Xuan Zhang

(57) ABSTRACT

The present application discloses a semiconductor device and a method for fabricating the semiconductor device. The semiconductor device includes a substrate; a plurality of first conductive structures positioned on the substrate; a plurality of outer liner layer each positioned on a corresponding sidewall of the plurality of first conductive structures; and a plurality of bottom inter-feature dielectric layers positioned on the plurality of outer liner layers and between the plurality of first conductive structures. Each of the outer liner layers includes one or more species of vanadium oxide. The plurality of bottom inter-feature dielectric layers are porous.

11 Claims, 11 Drawing Sheets

SEMICONDUCTOR DEVICE WITH POROUS DIELECTRIC LAYERS AND METHOD FOR FABRICATING THE SAME

CROSS-REFERENCE TO RELATED APPLICATION

This application is a divisional application of U.S. Non-Provisional Application No. 17/870,087 filed 21 Jul. 2022, which is incorporated herein by reference in its entirety.

TECHNICAL FIELD

The present disclosure relates to a semiconductor device and a method for fabricating the semiconductor device, and more particularly, to a semiconductor device with porous dielectric layers.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate; a plurality of first conductive structures positioned on the substrate; a plurality of outer liner layers positioned along sidewalls of the plurality of first conductive structures; and a plurality of bottom inter-feature dielectric layers positioned on the plurality of outer liner layers and between the plurality of first conductive structures. Each of the outer liner layers one or more species of vanadium oxide. The plurality of bottom inter-feature dielectric layers are porous.

Another aspect of the present disclosure provides semiconductor device including a substrate including a dense area and an open area; a plurality of first conductive structures positioned on the dense area; a plurality of second conductive structures positioned on the open area; a plurality of outer liner layers positioned along sidewalls of the plurality of first conductive structures and on sidewalls of the plurality of second conductive structures; and a plurality of bottom inter-feature dielectric layers positioned on the plurality of outer liner layers, between the plurality of first conductive structures, and between the plurality of second conductive structures. A pitch of the plurality of first conductive structures is less than a pitch of the plurality of second conductive structures. Each of the outer liner layers includes one or more species of vanadium oxide. The plurality of bottom inter-feature dielectric layers are porous.

Another aspect of the present disclosure provides a method for fabricating a semiconductor device including providing a substrate including a dense area and an open area; forming a plurality of first conductive structures on the dense area; forming a plurality of second conductive structures on the open area; conformally forming a plurality of outer liner layer on sidewalls of the plurality of first conductive structures and on sidewalls of the plurality of second conductive structures; forming a plurality of bottom inter-feature dielectric layers on the plurality of outer liner layers, between the plurality of first conductive structures, and between the plurality of second conductive structures; and forming a plurality of top inter-feature dielectric layers on the plurality of bottom inter-feature dielectric layers, between the plurality of first conductive structures, and between the plurality of second conductive structures. A pitch of the plurality of first conductive structures is less than a pitch of the plurality of second conductive structures. The plurality of outer liner layers include one or more species of vanadium oxide. The plurality of bottom inter-feature dielectric layers are porous.

Due to the design of the semiconductor device of the present disclosure, the low dielectric constant of the plurality of outer liner layers and the plurality of bottom inter-feature dielectric layers may reduce the parasitic capacitance between adjacent first conductive structures or between adjacent second conductive structures. As a result, the performance of the semiconductor device may be improved. In addition, the plurality of top inter-feature dielectric layers may serve as protecting layers to the plurality of bottom inter-feature dielectric layers. Therefore, the process window and yield of fabricating the semiconductor device may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
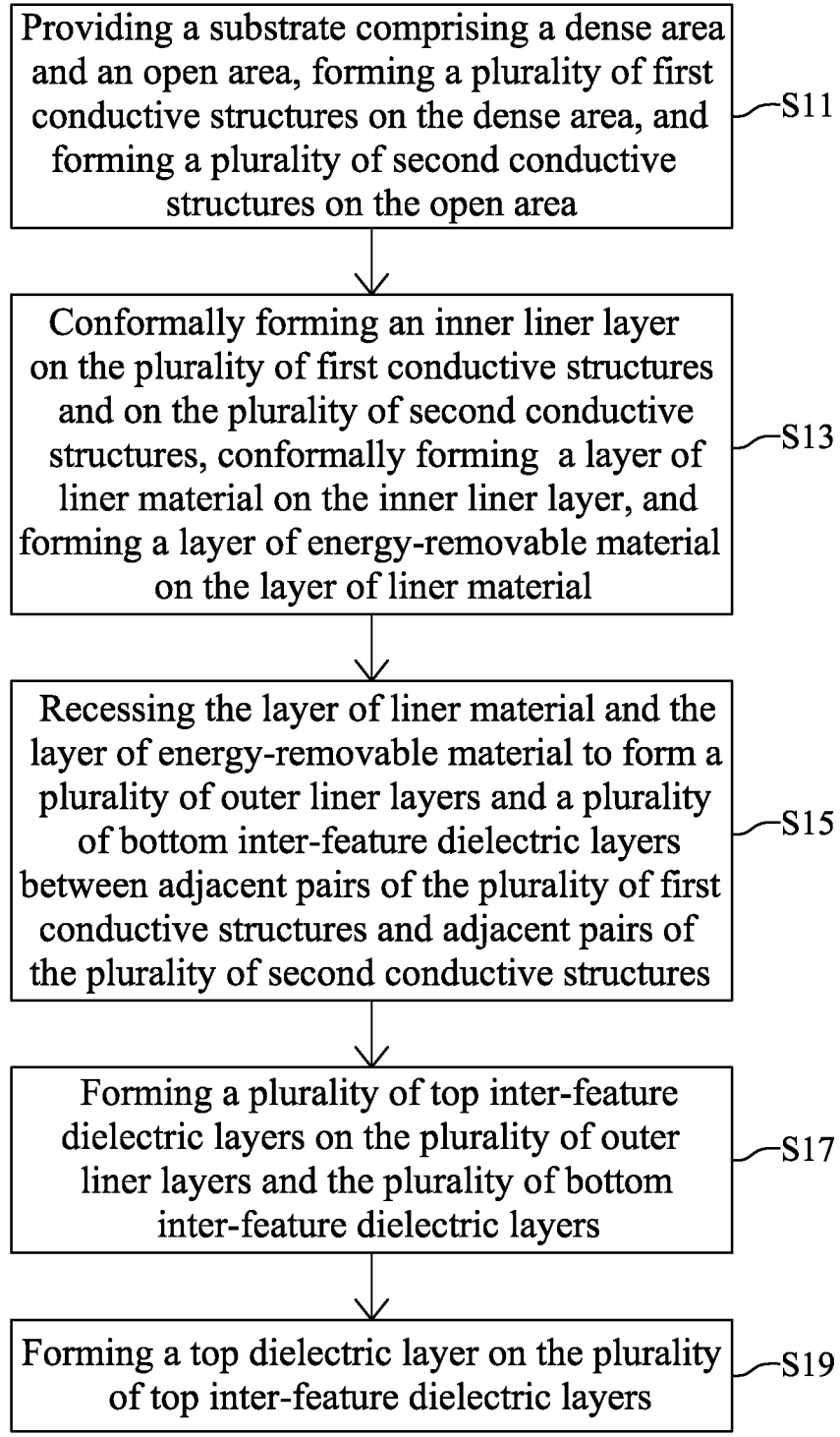
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

It should be noted that, in the description of the present disclosure, the terms "forming," "formed" and "form" may mean and include any method of creating, building, patterning, implanting, or depositing an element, a dopant or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching, and wet etching.

It should be noted that, in the description of the present disclosure, the functions or steps noted herein may occur in an order different from the order noted in the figures. For example, two figures shown in succession may in fact be executed substantially concurrently or may sometimes be executed in a reversed order, depending upon the functionalities or steps involved.

FIG. 1 illustrates, in a flowchart diagram form, a method 10 for fabricating a semiconductor device 1 in accordance with one embodiment of the present disclosure. FIGS. 2 to 11 illustrate, in schematic cross-sectional view diagrams, a flow for fabricating the semiconductor device 1 in accordance with one embodiment of the present disclosure.

With reference to FIGS. 1 to 4, at step S11, a substrate 111 comprising a dense area DA and an open area OA may be provided, a plurality of first conductive structures 210 may be formed on the dense area DA, and a plurality of second conductive structures 220 may be formed on the open area OA.

Figure 2:
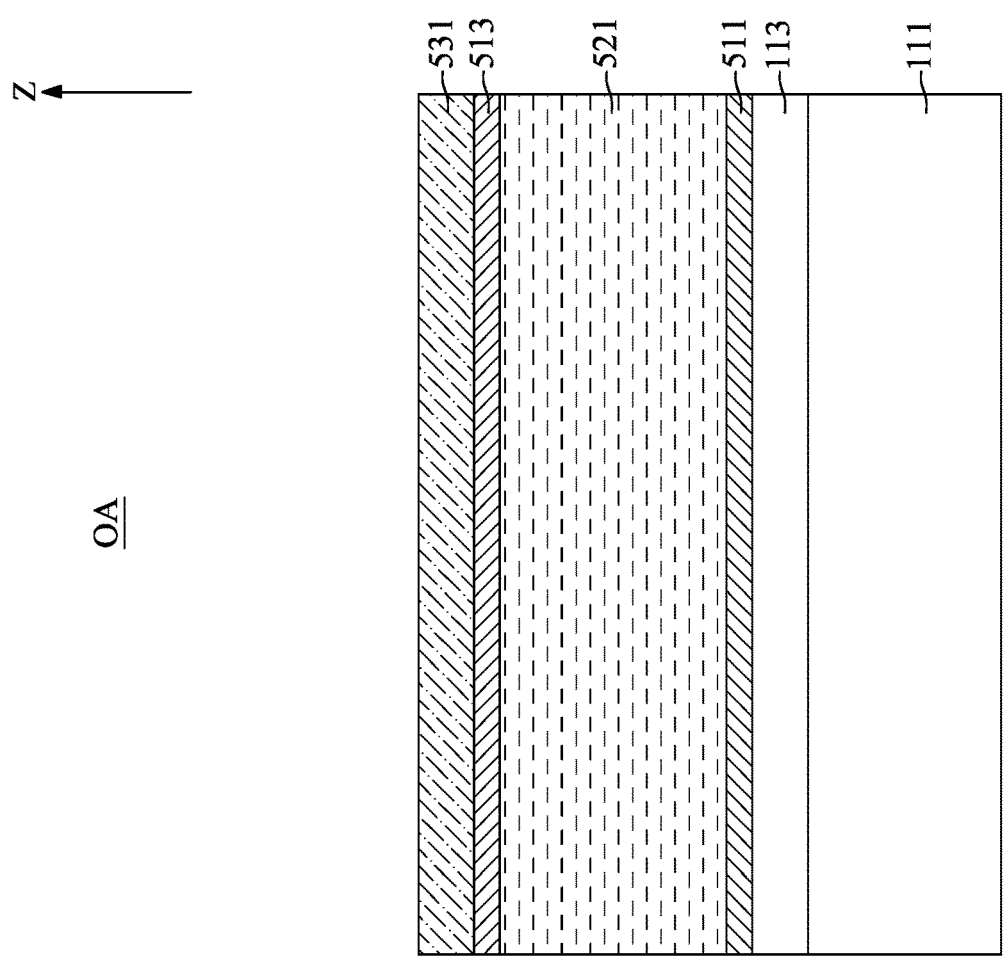
FIGS. 2 to 11 illustrate, in schematic cross-sectional view diagrams, a flow for fabricating the semiconductor device in accordance with one embodiment of the present disclosure.

With reference to FIG. 2, in some embodiments, the open area OA may be next to the dense area DA. Alternatively, in some embodiments, the open area OA may be distant from the dense area DA. It should be noted that, in the description of the present disclosure, the dense area DA may comprise a portion of the substrate 111 and spaces above and under the portion of the substrate 111. Describing an element as being disposed on the dense area DA means that the element is disposed on a top surface of the portion of the substrate 111. Describing an element as being disposed in the dense area DA means that the element is disposed in the portion of the substrate 111; however, a top surface of the element may be even with the top surface of the portion of the substrate 111. Describing an element as being disposed above the dense area DA means that the element is disposed above the top surface of the portion of the substrate 111. Describing an element as being disposed under the dense area DA means that the element is disposed under the bottom surface of the portion of the substrate 111; wherein the element contacts the bottom surface of the portion of the substrate 111 or is distant from the bottom surface of the portion of the substrate 111. Accordingly, the open area OA may comprise another portion of the substrate 111 and spaces above and under the other portion of the substrate 111.

It should be noted that, in the description of the present disclosure, a surface of an element (or a feature) located at the highest vertical level along the dimension Z is referred to as a top surface of the element (or the feature). A surface of an element (or a feature) located at the lowest vertical level along the dimension Z is referred to as a bottom surface of the element (or the feature).

With reference to FIG. 2, in some embodiments, the substrate 111 may include a bulk semiconductor substrate that is composed entirely of at least one semiconductor material, a plurality of device elements (not shown for clarity), a plurality of dielectric layers (not shown for clarity), and a plurality of conductive features (not shown for clarity). The bulk semiconductor substrate may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor; or combinations thereof.

In some embodiments, the substrate 111 may further include a semiconductor-on-insulator structure which consists of, from bottom to top, a handle substrate, an insulator layer, and a topmost semiconductor material layer. The handle substrate and the topmost semiconductor material layer may be formed of the same material as the bulk semiconductor substrate aforementioned. The insulator layer may be a crystalline or non-crystalline dielectric material such as an oxide and/or nitride. For example, the insulator layer may be a dielectric oxide such as silicon oxide. For another example, the insulator layer may be a dielectric nitride such as silicon nitride or boron nitride. For yet another example, the insulator layer may include a stack of a dielectric oxide and a dielectric nitride such as a stack of, in any order, silicon oxide and silicon nitride or boron nitride. The insulator layer may have a thickness between about 10 nm and 200 nm.

It should be noted that, in the description of present disclosure, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 9, 8, 7, 6, 5, 4, 3, 2, or 1% of the reported numerical value.

The plurality of device elements may be formed on the substrate 111. Some portions of the plurality of device elements may be formed in the substrate 111. The plurality of device elements may be transistors such as complementary metal-oxide-semiconductor transistors, metal-oxide-semiconductor field-effect transistors, fin field-effect-transistors, the like, or a combination thereof.

The plurality of dielectric layers may be formed on the substrate 111 and cover the plurality of device elements. In some embodiments, the plurality of dielectric layers may be formed of, for example, silicon oxide, borophosphosilicate glass, undoped silicate glass, fluorinated silicate glass, low-k dielectric materials, the like, or a combination thereof. The low-k dielectric materials may have a dielectric constant less than 3.0 or even less than 2.5. In some embodiments, the low-k dielectric materials may have a dielectric constant less than 2.0. The plurality of dielectric layers may be formed by deposition processes such as chemical vapor deposition, plasma-enhanced chemical vapor deposition, or the like. Planarization processes may be performed after the deposition processes to remove excess material and provide a substantially flat surface for subsequent processing steps.

The plurality of conductive features may include interconnect layers, conductive vias, and conductive pads. The interconnect layers may be separated from each other and may be horizontally disposed in the plurality of dielectric layers along the direction Z. In the present embodiment, the topmost interconnect layers may be designated as the conductive pads. The conductive vias may connect adjacent interconnect layers along the direction Z, adjacent device element and interconnect layer, and adjacent conductive pad and interconnect layer. In some embodiments, the conductive vias may improve heat dissipation and may provide structure support. In some embodiments, the plurality of conductive features may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The plurality of conductive features may be formed during the formation of the plurality of dielectric layers.

With reference to FIG. 2, a bottom dielectric layer 113 may be formed on the substrate 111. In some embodiments, the bottom dielectric layer 113 may be configured as an etch stop layer. Generally, the etch stop layer may provide a mechanism to stop an etch process when forming conductive features. The etch stop layer may be preferably formed of a dielectric material having a different etch selectivity from adjacent layers. For example, the etch stop layer may be formed of, for example, silicon nitride, silicon carbonitride, silicon oxycarbide, the like, or a combination thereof. The bottom dielectric layer 113 may be formed by chemical vapor deposition or plasma enhanced chemical vapor deposition.

In some embodiments, the bottom dielectric layer 113 may be formed of, for example, silicon oxide, borophosphosilicate glass, undoped silicate glass, fluorinated silicate glass, the like, or a combination thereof. In some embodiments, the undoped silicate glass can be expressed as formula $SiO_x$. The x may be between 1.4 and 2.1. In some embodiments, the bottom dielectric layer 113 may be formed by a deposition process such as chemical vapor deposition, plasma enhanced chemical vapor deposition, or other applicable deposition process.

In some embodiments, the bottom dielectric layer 113 may include, for example, silicon dioxide, undoped silicate glass, fluorosilicate glass, borophosphosilicate glass, a spin-on low-k dielectric layer, a chemical vapor deposition low-k dielectric layer, or a combination thereof. The term "low-k" as used throughout the present application denotes a dielectric material that has a dielectric constant of less than silicon dioxide. In some embodiments, the bottom dielectric layer 113 may include a self-planarizing material such as a spin-on glass or a spin-on low-k dielectric material such as SiLK™. The use of a self-planarizing dielectric material may avoid the need to perform a subsequent planarizing step. In some embodiments, the bottom dielectric layer 113 may be formed by a deposition process including, for example, chemical vapor deposition, plasma enhanced chemical vapor deposition, spin-on coating, or other applicable deposition process.

In some embodiments, the bottom dielectric layer 113 may be referred to as part of the plurality of dielectric layers of the substrate 111.

With reference to FIG. 2, the layer of first barrier material 511 may be formed on the bottom dielectric layer 113. In some embodiments, the layer of first barrier material 511 may be formed by, for example, chemical vapor deposition, atomic layer deposition, physical vapor deposition, or other applicable deposition process. The layer of first barrier material 511 may prevent metal ion of the first conductive material 521, which will be illustrated later, diffusing into the bottom dielectric layer 113 or the substrate 111. The layer of first barrier material 511 may also improve the adhesion between the bottom dielectric layer 113 and the layer of first conductive material 521. In some embodiments, the first barrier material 511 may include, for example, titanium, titanium nitride, or a combination thereof. In some embodiments, the layer of first barrier material 511 may include a columnar grain structure.

With reference to FIG. 2, the layer of first conductive material 521 may be formed on the layer of first barrier material 511. In some embodiments, the first conductive material 521 may be, for example, aluminum, copper, aluminum-copper alloy, or other applicable conductive materials. In the present embodiment, the first conductive material 521 is aluminum-copper alloy. In some embodiments, the thickness of the layer of first conductive material 521 may be between about 4000 Angstroms and about 11,000 Angstroms. In some embodiments, the layer of first conductive material 521 may be formed by, for example, a metal radio frequency sputtering or other applicable deposition processes. In some embodiments, the temperature of the metal radio frequency sputtering may be between about 100° C. and about 400° C. In some embodiments, the pressure of the metal radio frequency sputtering may be between about 1 mTorr and about 100 mTorr. The small quantities of copper in the aluminum may improve the electromigration resistance and reduce the occurrence of hillocks, that is small protrusions of aluminum on a surface of a layer of pure aluminum.

With reference to FIG. 2, the layer of second barrier material 513 may be formed on the layer of first conductive material 521. In some embodiments, the layer of second barrier material 513 may be formed by, for example, chemical vapor deposition, atomic layer deposition, physical vapor deposition, or other applicable deposition process. The layer of second barrier material 513 may prevent metal ion of the first conductive material 521 diffusing into a layer of first material 531, which will be illustrated later. The layer of second barrier material 513 may also improve the adhesion between the layer of first material 531 and the layer of first conductive material 521. In some embodiments, the second barrier material 513 may include, for example, titanium, titanium nitride, or a combination thereof. In some embodiments, the layer of second barrier material 513 may include a columnar grain structure.

With reference to FIG. 2, a layer of first material 531 may be formed on the layer of second barrier material 513. In some embodiments, the layer of first material 531 may be configured as an anti-reflective layer. In some embodiments, the layer of first material 531 may consist of thin film structures with alternating layers of contrasting refractive index. The thickness of the layer of first material 531 may be chosen to produce destructive interference in the beams reflected from the interfaces, and constructive interference in the corresponding transmitted beams. By way of example, and by no means limiting, the first material 531 may include, for example, oxides, sulfides, fluorides, nitrides, selenides, or a combination thereof. The layer of first material 531 may improve the resolution of the lithography process.

Figure 3:
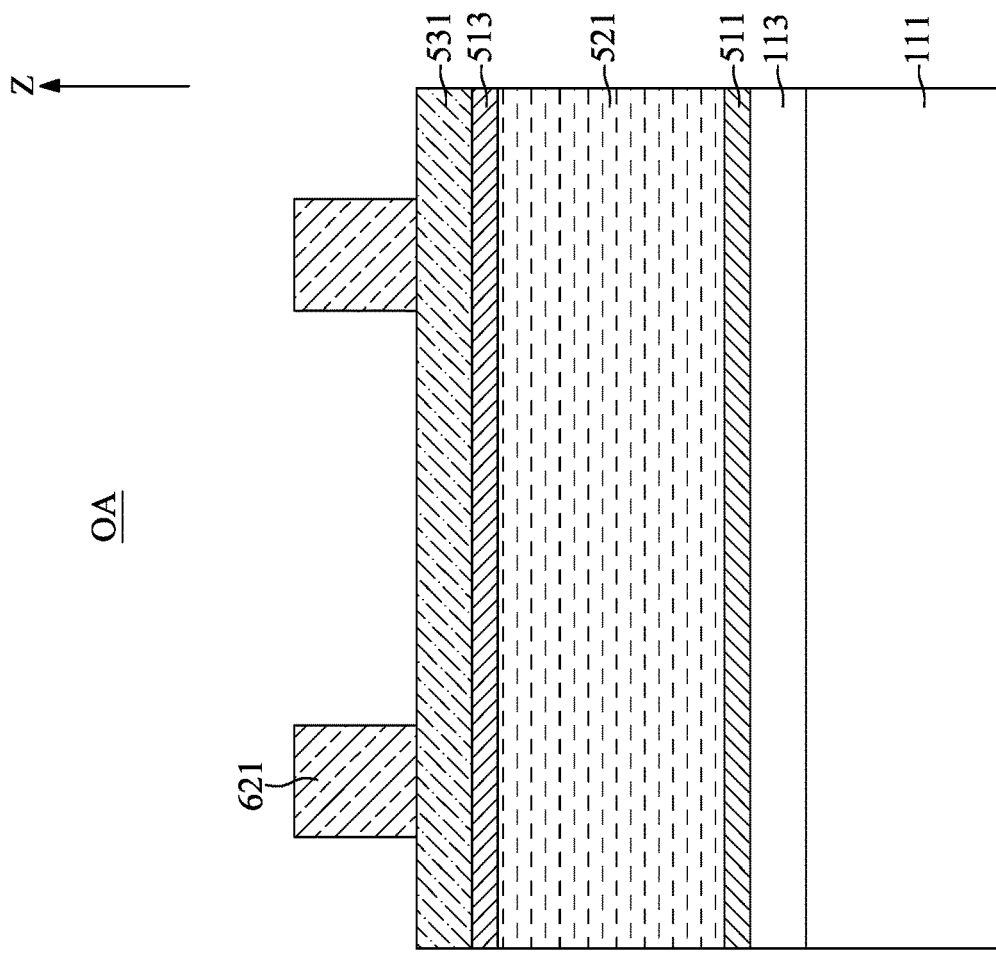

With reference to FIG. 3, a first mask layer 621 may be formed on the layer of first material 531. The first mask layer 621 may include the pattern of the plurality of first conductive structures 210 and the plurality of second conductive structures 220. In some embodiments, the first mask layer 621 may be a photoresist layer.

Figure 4:
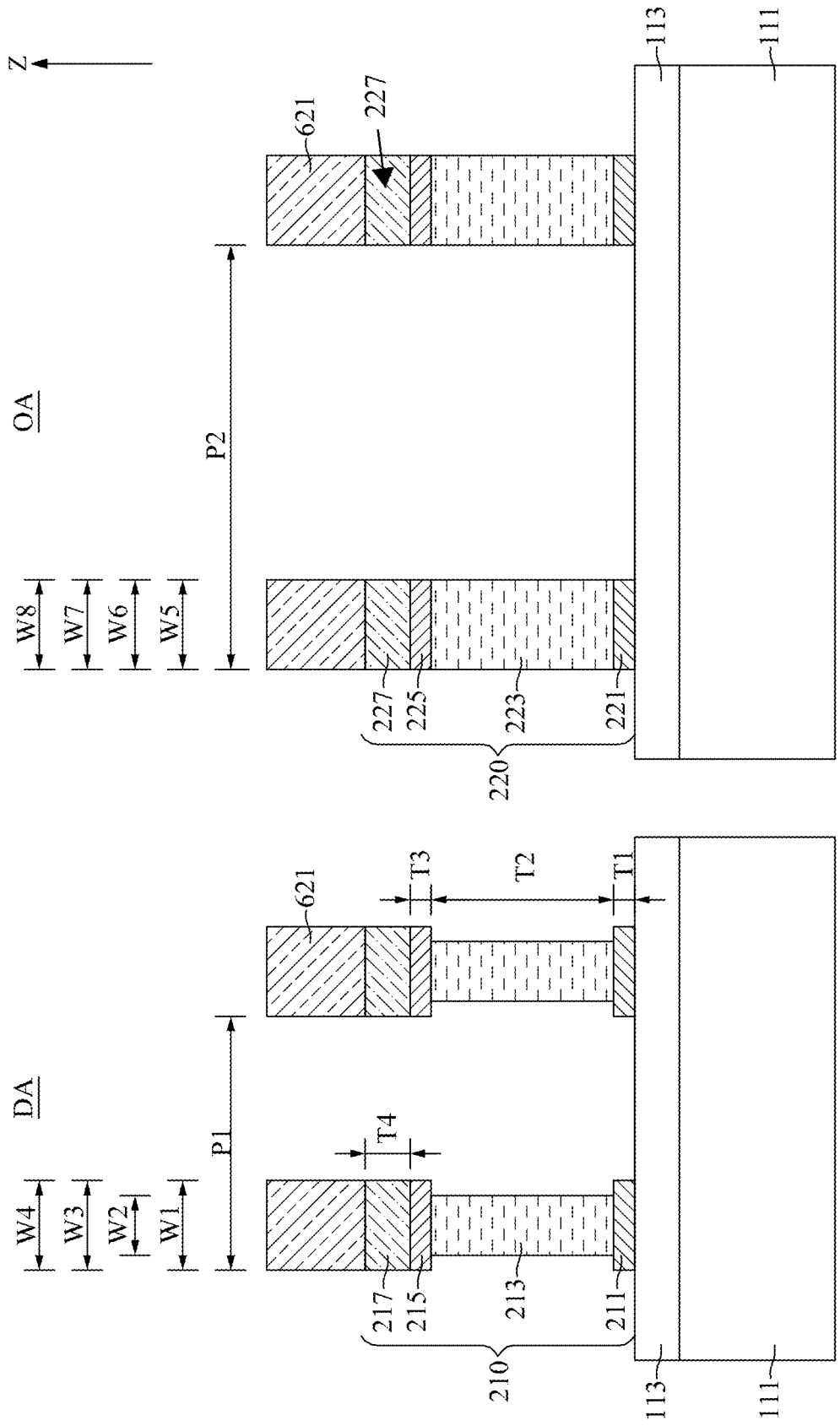

With reference to FIG. 4, a plug etching process may be performed using the first mask layer 621 as the mask to remove portions of the first barrier material 511, portions of the first conductive material 521, portions of the second barrier material 513, and portions of the first material 531. The plug etching process may be a multi-stage process. The etching chemistries and parameters may be varied corresponding to the layer to be etched. For example, during etching of the layer of first conductive material 521, the etchants may include chlorine and argon, the temperature of etching may be between about 50° C. and about 200° C., the etchant flow of chlorine may be about 20 standard cubic centimeters per minute (sccm), the etchant flow of argon may be about 1000 sccm, the pressure may be between about 50 mTorr and about 10 Torr, and the duration may be between about 30 seconds and about 200 seconds.

In some embodiments, the plug etching process may be an anisotropic etching process, such as anisotropic dry etching process. In some embodiments, some stages of the plug etching process may be anisotropic etching processes and some stages of the plug etching process may be isotropic etching processes.

With reference to FIG. 4, after the plug etching process, the remaining first barrier material 511 may be referred to as a plurality of first bottom barrier layers 211 and a plurality of second bottom barrier layers 221. The plurality of first bottom barrier layers 211 may be formed above the dense area DA. The plurality of second bottom barrier layers 221 may be formed above the open area OA.

The remaining first conductive material 521 may be referred to as a plurality of first body portions 213 and a plurality of second body portions 223. The plurality of first body portions 213 may be formed on the plurality of first bottom barrier layers 211. The plurality of second body portions 223 may be formed on the plurality of second bottom barrier layers 221.

The remaining second barrier material 513 may be referred to as a plurality of first top barrier layers 215 and a plurality of second top barrier layers 225. The plurality of first top barrier layers 215 may be formed on the plurality of first body portions 213. The plurality of second top barrier layers 225 may be formed on the plurality of second body portions 223.

The remaining first material 531 may be referred to as a plurality of first dielectric portions 217 and a plurality of second dielectric portions 227. The plurality of first dielectric portions 217 may be formed on the plurality of first top barrier layers 215. The plurality of second dielectric portions 227 may be formed on the plurality of second top barrier layers 225. After the plug etching process, the first mask layer 621 may be removed by, for example, an ashing process or other applicable semiconductor process.

With reference to FIG. 4, the plurality of first bottom barrier layers 211, the plurality of first body portions 213, the plurality of first top barrier layers 215, and the plurality of first dielectric portions 217 together configure the plurality of first conductive structures 210 formed on the bottom dielectric layer 113 and over the dense area DA. The plurality of second bottom barrier layers 221, the plurality of second body portions 223, the plurality of second top barrier layers 225, and the plurality of second dielectric portions 227 together configure the plurality of second conductive structures 220 formed on the bottom dielectric layer 113 and over the open area OA.

With reference to FIG. 4, the plurality of first conductive structures 210 may have an element density greater than an element density of the plurality of second conductive structures 220. The element density may be a value defined by the elements (e.g., the first conductive structures 210 and the second conductive structures 220) divided by a given area from a top-view perspective. From a cross-sectional perspective, a greater density may mean a smaller horizontal distance between adjacent elements. In other words, the pitch P1 of an adjacent pair of the plurality of first conductive structures 210 may be less than the pitch P2 of an adjacent pair of the plurality of second conductive structures 220.

With reference to FIG. 4, in some embodiments, due to the difference of element densities, the width W1 of the first bottom barrier layer 211 may be larger than the width W2 of the first body portion 213. The thinner first body portion 213 may reduce parasitic capacitance between adjacent pair of the plurality of first conductive structures 210. Alternatively, in some embodiments, the width W1 of the first bottom barrier layer 211 and the width W2 of the first body portion 213 may be substantially the same.

With reference to FIG. 4, in some embodiments, the width W1 of the first bottom barrier layer 211 and the width W3 of the first top barrier layer 215 may be substantially the same. In some embodiments, the width W1 of the first bottom barrier layer 211 and the width W4 of the first dielectric portion 217 may be substantially the same.

With reference to FIG. 4, in some embodiments, the width W5 of the second bottom barrier layer 221 and the width W6 of the second body portion 223 may be substantially the same. In some embodiments, the width W5 of the second bottom barrier layer 221 and the width W7 of the second top barrier layer 225 may be substantially the same. In some embodiments, the width W5 of the second bottom barrier layer 221 and the width W8 of the second dielectric portion 227 may be substantially the same.

With reference to FIG. 1 and FIGS. 5 to 7, at step S13, an inner liner layer 311 may be conformally formed along the plurality of first conductive structures 210 and along the plurality of second conductive structures 220, a layer of liner material 611 may be conformally formed along the inner liner layer 311, and a layer of energy-removable material 613 may be formed along the layer of liner material 611.

Figure 5:
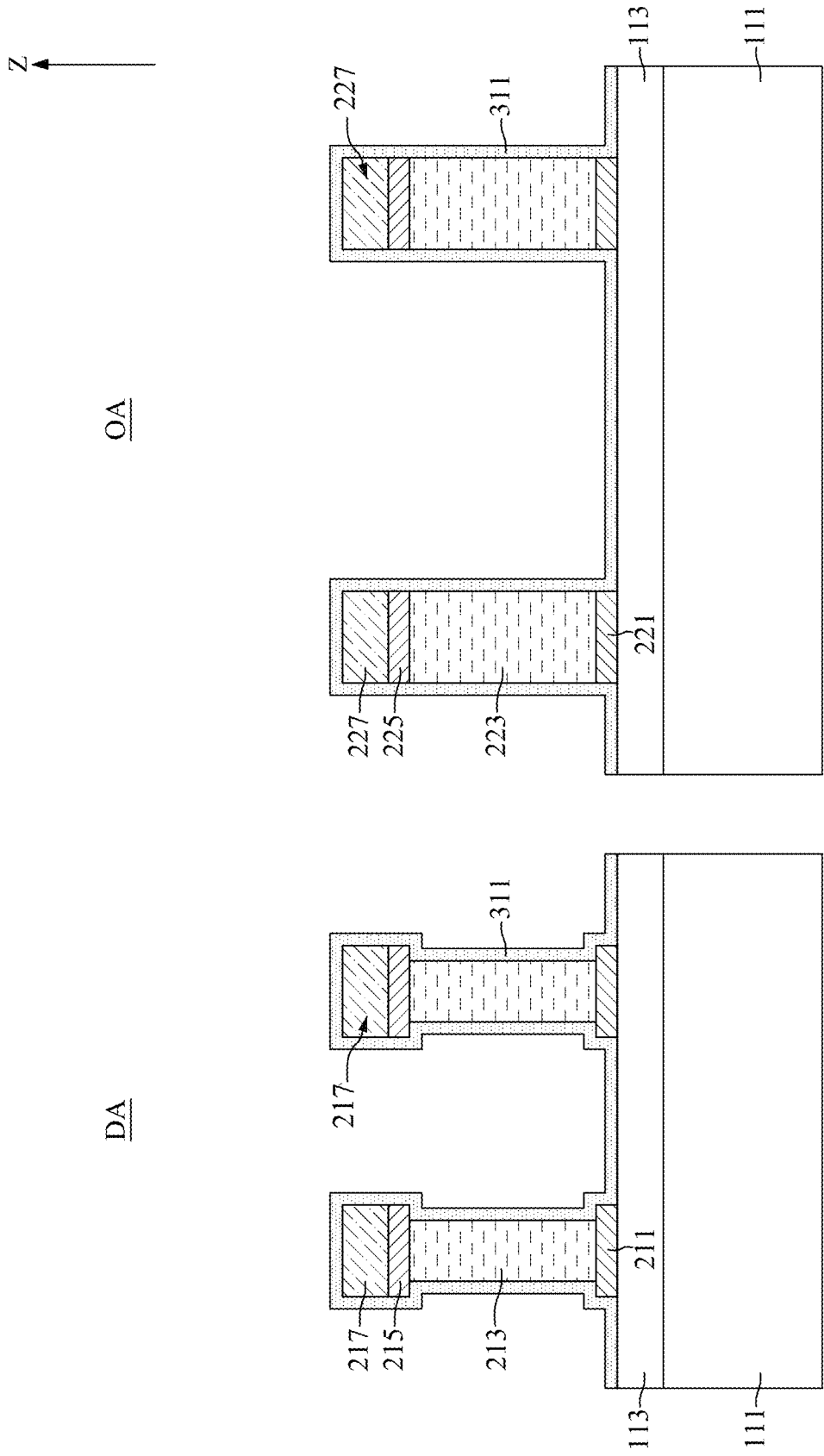

With reference to FIG. 5, the inner liner layer 311 may conformally formed on the bottom dielectric layer 113, on the plurality of first conductive structures 210, and on the plurality of second conductive structures 220. In some embodiments, the inner liner layer 311 may be formed of, for example, silicon nitride, silicon oxynitride, silicon nitride oxide, or a combination thereof. In the present embodiment, the inner liner layer 311 may be formed of silicon nitride. In some embodiments, the inner liner layer 311 may be formed by, for example, atomic layer deposition, chemical vapor deposition, plasma-enhanced chemical vapor deposition, or other applicable deposition process.

It should be noted that, in the description of the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

It should be noted that, in the description of the present disclosure, the term "conformal", or "conformally", refers to a layer that adheres to and uniformly covers exposed surfaces with a thickness having a variation of less than 5% relative to the average thickness of the film. For example, a 1,000 angstroms thick film would have less than 50 angstroms variations in thickness. This thickness and variation may include edges, corners, sides, and the bottom of recesses. For example, a conformal layer deposited by atomic layer deposition in various embodiments of the disclosure would provide coverage over the deposited region of essentially uniform thickness on complex surfaces.

In the present embodiment, the inner liner layer 311 may be formed by atomic layer deposition. Generally, an atomic layer deposition process is based on typically self-limiting reactions, whereby sequential and alternating pulses of reactants are used to deposit about one atomic (or molecular) monolayer of material per deposition cycle. The deposition conditions and precursors are typically selected to provide self-saturating reactions, such that an adsorbed layer of one reactant leaves a surface termination that is non-reactive with the gas phase reactants of the same reactant. The substrate is subsequently contacted with a different reactant that reacts with the previous termination to enable continued deposition. Thus, each cycle of alternated pulses typically leaves no more than about one monolayer of the desired material. However, in some embodiments, more than one monolayer of material may be deposited in one or more atomic layer deposition cycles.

Detailedly, the formation of the inner liner layer 311 using the atomic layer deposition may include a first phase and a second phase. In the first phase (also referred to as the silicon phase), the surface on which deposition is desired is contacted with a first vapor phase reactant including a silicon precursor which chemisorbed onto the surface, forming no more than about one monolayer of reactant species on the surface. It should be appreciated that in some embodiments, each contacting step may be repeated one or more times prior to advancing on to the subsequent processing step, i.e., prior to a subsequent contacting step or removal/purge step.

In some embodiments, the silicon precursor, also referred to herein as the "silicon compound" may include a silicon halide source. In some embodiments, the first reactant may comprise a silicon halide source and may further include at least one of silicon tetraiodide, silicon tetrabromide, silicon tetrachloride, hexachlorodisilane, hexaiododisilane, octoiodotrisilane. In some embodiments, the silicon halide source may be preheated to provide sufficient vapor pressure for delivery to the reaction chamber. For example, in some embodiments the silicon halide precursor source may be preheated to a temperature of between about 90° C. and about 125° C., or about 100° C.

In some embodiments, exposing the surface to the silicon halide source may include pulsing the silicon precursor (e.g., the silicon tetraiodide) over the surface for a time period of between about 0.5 seconds and about 30 seconds, between about 0.5 seconds and about 10.0 seconds, or between about 0.5 seconds and about 5.0 seconds. In addition, during the pulsing of the silicon halide source over the surface, the flow rate of the silicon halide source may be less than 2000 sccm, less than 1000 sccm, less than 500 sccm, less than 250 sccm, or even less than 100 sccm.

After the first phase, excess silicon halide source and reaction byproducts (if any) may be removed from the surface by purging with an inert gas. For example, the surface may be purged for a time period of less than about 5.0 seconds. Excess silicon halide source and any reaction byproducts may be removed with the aid of a vacuum generated by a pumping system.

In the second phase (also referred to as "the nitrogen phase"), the surface may be contacted with a second vapor phase reactant comprising a nitrogen source.

In some embodiments, the nitrogen source may include at least one of ammonia, hydrazine, or an alkyl-hydrazine. The alkyl-hydrazine may refer to a derivative of hydrazine which may include an alkyl functional group and may also include additional functional groups, non-limiting example embodiments of an alkyl-hydrazine may include at least one of tertbutylhydrazine, methylhydrazine, or dimethylhydrazine.

In some embodiments, exposing the surface to the nitrogen source may include pulsing the nitrogen source (e.g., ammonia) over the surface for a time period of between about 0.5 seconds and about seconds, between about 0.5 seconds and about 10 seconds, or between about 0.5 second and about 5 seconds. During the pulsing of the nitrogen source over the surface, the flow rate of the nitrogen source may be less than 4000 sccm, less than 2000 sccm, less than 1000 sccm, or even less than 250 sccm.

After the second phase, excess second source chemical and reaction byproducts, if any, may be removed from the surface by a purging gas pulse and/or vacuum generated by a pumping system. Purging gas is preferably any inert gas, such as, without limitation, argon, nitrogen, or helium. A phase is generally considered to immediately follow another phase if a purge (i.e., purging gas pulse) or other reactant removal step intervenes.

The second vapor phase reactant including the nitrogen source may react with silicon-containing molecules left on the surface. The first phase and the second phase may be repeated one or more times until the desired thickness of the inner liner layer 311 is achieved.

In some embodiments, the intermediate semiconductor device which the inner liner layer 311 to be deposited to may be heated to a temperature of approximately less than 500° C., to a temperature of less than approximately 450° C., to a temperature of less than approximately 400° C., to a temperature of less than approximately 350° C., to a temperature of less than approximately 300° C., to a temperature of less than approximately 250° C., or even to a temperature of less than approximately 200° C.

In some embodiments, the pressure of the first phase and the second phase may be less than 50 Torr, less than 25 Torr, less than 10 Torr, or less than 5 Torr.

Figure 6:
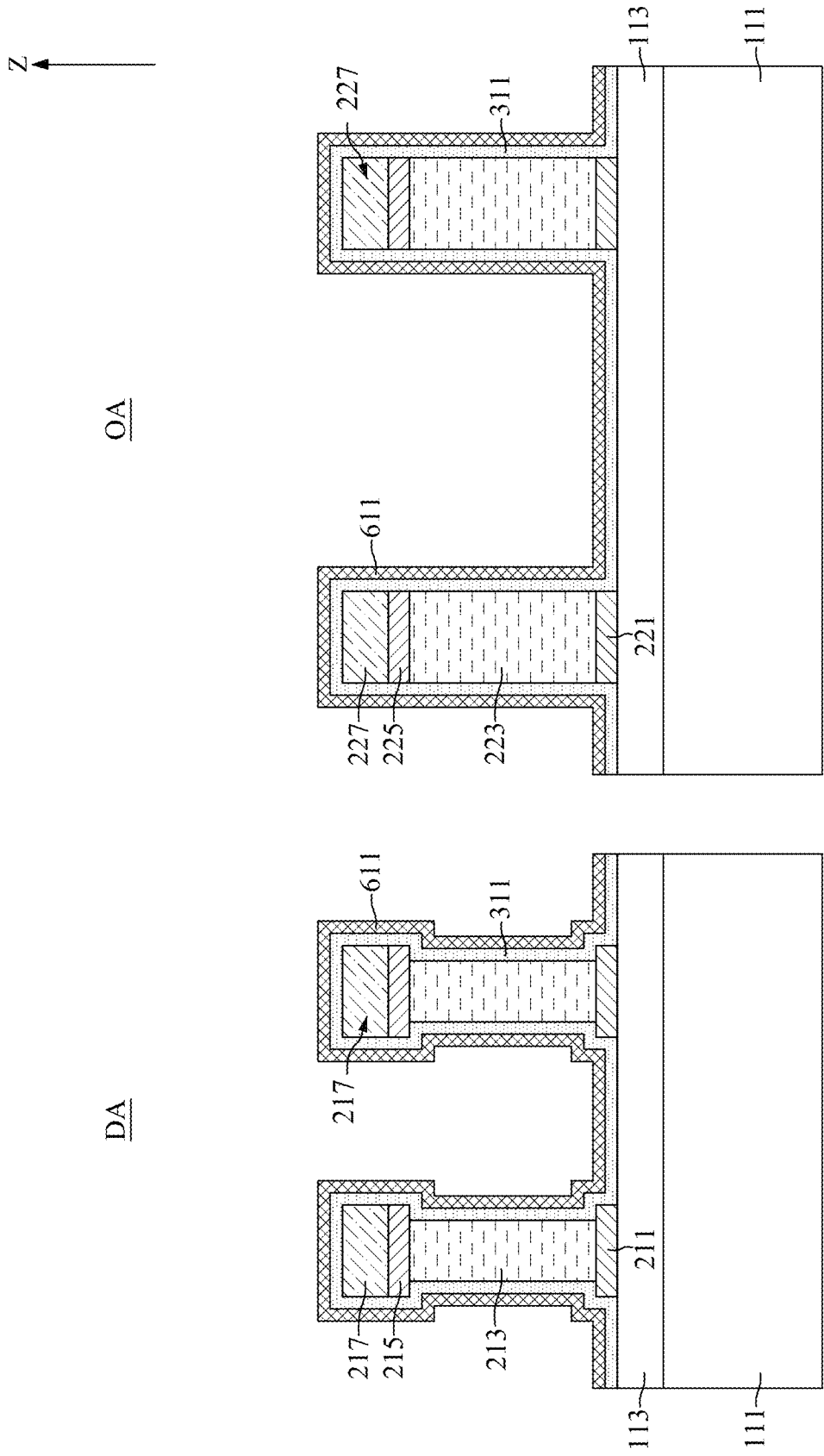

With reference to FIG. 6, a layer of liner material 611 may be conformally formed along the inner liner layer 311. In some embodiments, the liner material 611 may include vanadium and a low-k material. For example, the liner material 611 may include one or more species of vanadium oxide. The species of vanadium oxide are according to VON, wherein x is in the range of about 1 to about 3. In some embodiments, the dielectric constant of the liner material 611 may be between about 1 and about 3.

In some embodiments, the layer of liner material 611 may be formed by, for example, chemical vapor deposition, plasma-enhanced chemical vapor deposition, atomic layer deposition, or plasma-enhanced atomic layer deposition. The atomic layer deposition process can be performed by time-domain or spatial atomic layer deposition.

In a time-domain process, the substrate (e.g., the inner liner layer 311) are exposed to a single reactive gas at any given time. In an exemplary time-domain process, the processing chamber might be filled with a metal precursor for a time to allow the metal precursor to fully react with the available sites on the substrate. The processing chamber can then be purged of the precursor before flowing a second reactive gas into the processing chamber and allowing the second reactive gas to fully react with the substrate surface or material on the substrate surface. The time-domain process minimizes the mixing of reactive gases by ensuring that only one reactive gas is present in the processing chamber at any given time. At the beginning of any reactive gas exposure, there is a delay in which the concentration of the reactive species goes from zero to the final predetermined pressure. Similarly, there is a delay in purging all of the reactive species from the process chamber.

In a spatial atomic layer deposition, the substrate is moved between different process regions within a single processing chamber. Each of the individual process regions is separated from adjacent process regions by a gas curtain. The gas curtain helps prevent mixing of the reactive gases to minimize any gas phase reactions. Movement of the substrate through the different process regions allows the substrate to be sequentially exposed to the different reactive gases while preventing gas phase reactions.

In some embodiments, precursors of vanadium may be any vanadium-organometallic compound. Suitable vanadium precursors include, but are not limited to, vanadium oxytri-isopropoxide, vanadium oxytriethoxide, vanadium acetylacetonate, vanadium oxytrichloride, vanadium (III) chloride, vanadium (IV) chloride, and the like. The vanadium precursors may be delivered by a carrier gas such as argon, helenium, or hydrogen. In some embodiments, the reactant may include an oxygen source, a nitrogen source, a carbon source, a hydrogen source, a boron source, a silicon source, or combinations thereof.

In some embodiments, the layer of liner material 611 may be doped. The layer of liner material 611 may include dopants in an amount in the range of 0 to 50 atomic % of the layer. The dopants include but are not limited to carbon, nitrogen, silicon, boron, and fluorine.

Figure 7:
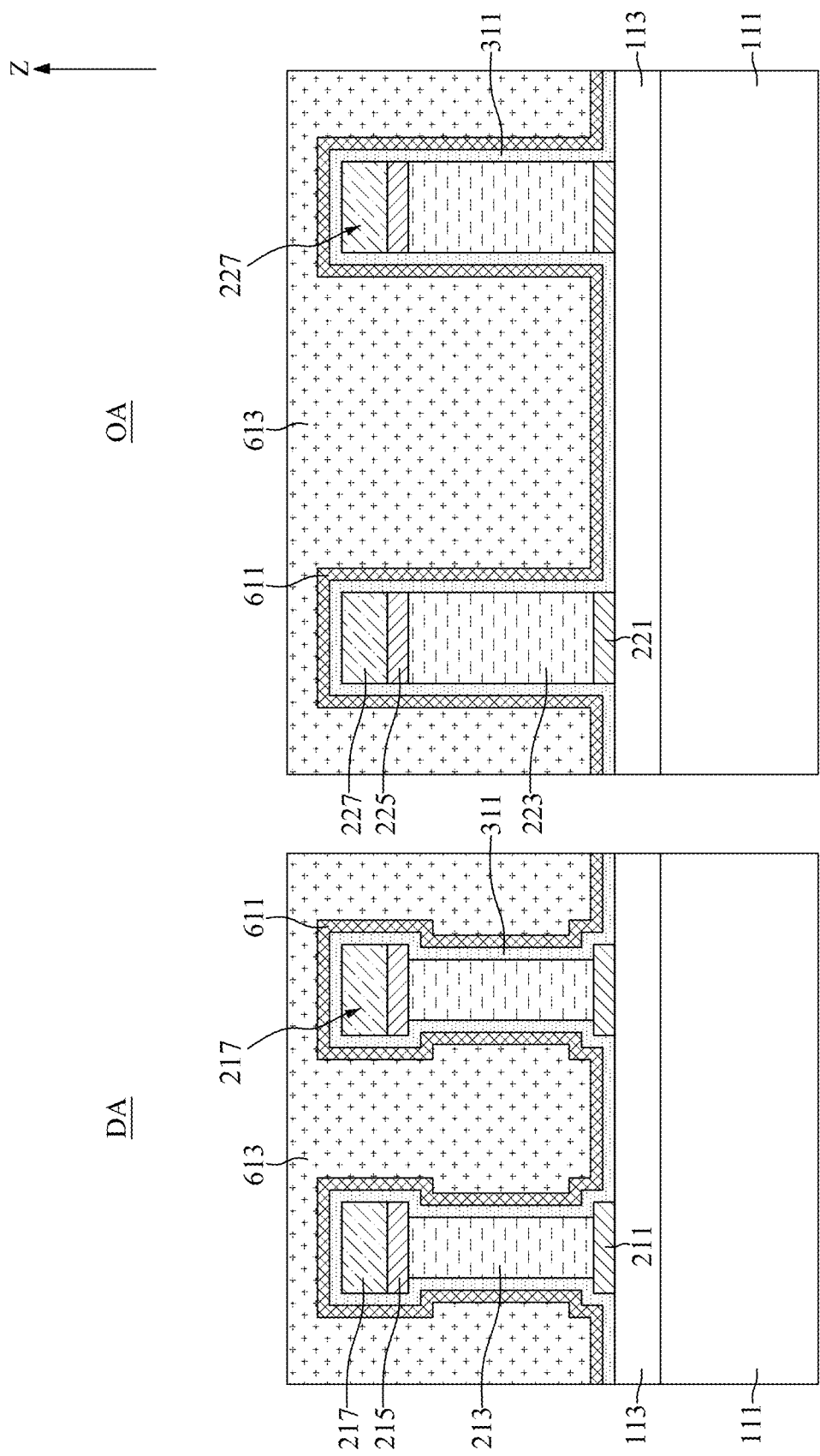

With reference to FIG. 7, the layer of energy-removable material 613 may be formed on the layer of liner material 611 and completely fill the spaces between the plurality of first conductive structures 210 and the spaces between the plurality of second conductive structures 220.

In some embodiments, the energy-removable material 613 may include a thermal decomposable material, a photonic decomposable material, an e-beam decomposable material, or a combination thereof. For example, the energy-removable material 613 may include a base material and a decomposable porogen material that is sacrificially removed upon exposure to an energy source. The base material may include a methylsilsesquioxane based material. The decomposable porogen material may include a porogen organic compound that provides porosity to the base material.

In some embodiments, the energy-removable material 613 may include a relatively high concentration of the decomposable porogen material and a relatively low concentration of the base material but is not limited thereto. For example, the energy-removable material 613 may include about 75% or greater of the decomposable porogen material, and about 25% or less of the base material. In another example, the energy-removable material 613 may include about 95% or greater of the decomposable porogen material, and about 5% or less of the base material. In another example, the energy-removable material 613 may include about 100% of the decomposable porogen material, and no base material is used. In another example, the energy-removable material 613 may include about 45% or greater of the decomposable porogen material, and about 55% or less of the base material.

Figure 8:
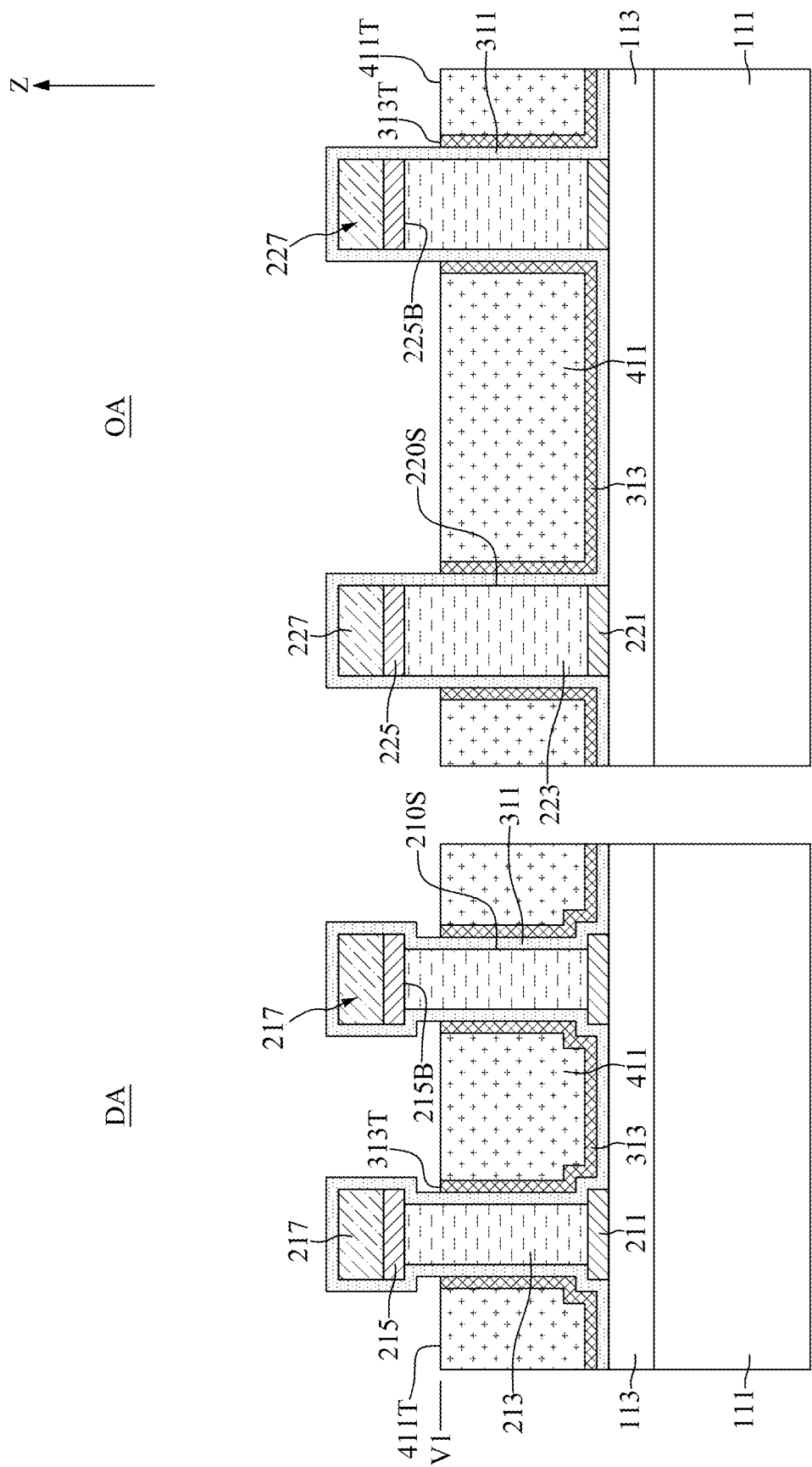

With reference to FIGS. 1 and 8, at step S15, the layer of liner material 611 and the layer of energy-removable material 613 may be recessed to form a plurality of outer liner layers 313 and a plurality of bottom inter-feature dielectric layers 411 between adjacent pairs of the plurality of first conductive structures 210 and adjacent pairs of the plurality of second conductive structures 220.

With reference to FIG. 8, an etching back process may be performed to remove portions of the liner material 611 and portions of the energy-removable material 613. In some embodiments, the etch rate ratio of the energy-removable material 613 to the inner liner layer 311 may be between about 100:1 and about 1.05:1, between about 15:1 and about 2:1, or between about 10:1 and about 2:1 during the etching back process. In some embodiments, the etch rate ratio of the liner material 611 to the inner liner layer 311 may be between about 100:1 and about 1.05:1, between about 15:1 and about 2:1, or between about 10:1 and about 2:1 during the etching back process.

After the etching back process, the remaining liner material 611 may be turned into the plurality of outer liner layers 313 on the sidewalls 210S of the plurality of first conductive structures 210 and on the sidewalls 220S of the plurality of first conductive structures 210. The remaining energy-removable material 613 may be turned into the plurality of bottom inter-feature dielectric layers 411 on the plurality of outer liner layers 313, between the adjacent pairs of the plurality of first conductive structures 210, and between the adjacent pairs of the plurality of second conductive structures 220.

With reference to FIG. 8, the top surfaces 313T of the plurality of outer liner layers 313 and the top surfaces 411T of the plurality of bottom inter-feature dielectric layers 411 may be at a vertical level V1 lower than the bottom surfaces 215B of first top barrier layer 215 or the bottom surfaces 225B of the second top barrier layer 225. Alternatively, in some embodiments, the top surfaces 313T of the plurality of outer liner layers 313 and the top surfaces 411T of the plurality of bottom inter-feature dielectric layers 411 may be at a vertical level higher than the bottom surfaces 215B of first top barrier layer 215 or the bottom surfaces 225B of the second top barrier layer 225.

After the etching back process, an energy treatment may be performed to the intermediate semiconductor device in FIG. 8 by applying the energy source thereto. The energy source may include heat, light, or a combination thereof. When heat is used as the energy source, the temperature of the energy treatment may be between about 800° C. and about 900° C. When light is used as the energy source, an ultraviolet light may be applied. The energy treatment may remove the decomposable porogen material from the energy-removable material 613 to generate empty spaces (pores), with the base material remaining in place. That is, the plurality of bottom inter-feature dielectric layers 411 may become porous. The base material may turn into a skeleton of the plurality of bottom inter-feature dielectric layers 411 and the empty spaces may be distributed among the skeleton of the plurality of bottom inter-feature dielectric layers 411. According to the composition of the energy-removable material 613, the plurality of bottom inter-feature dielectric layers 411 may have a porosity of 45%, 75%, 95%, or 100%.

Figure 9:
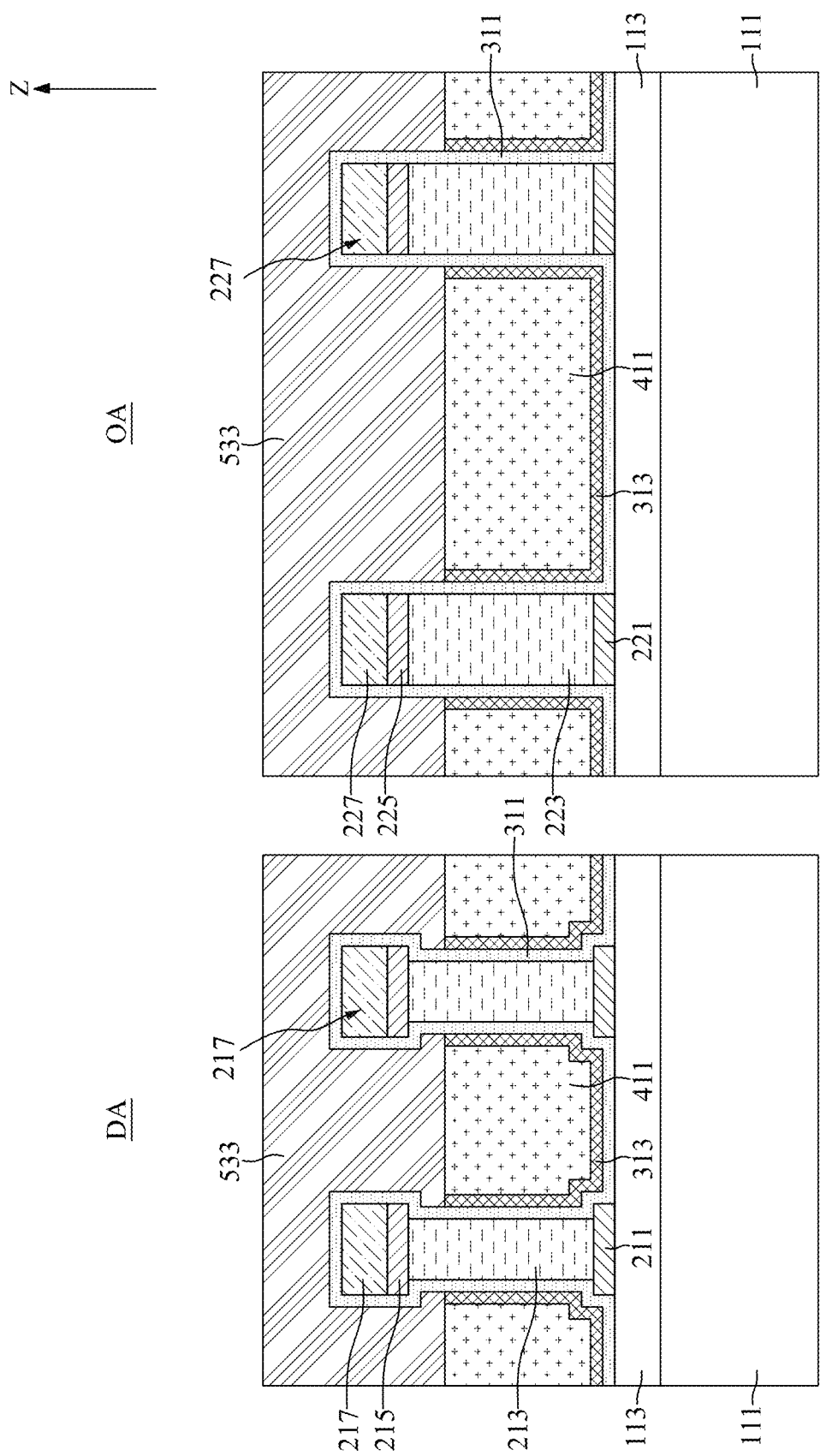
Figure 10:
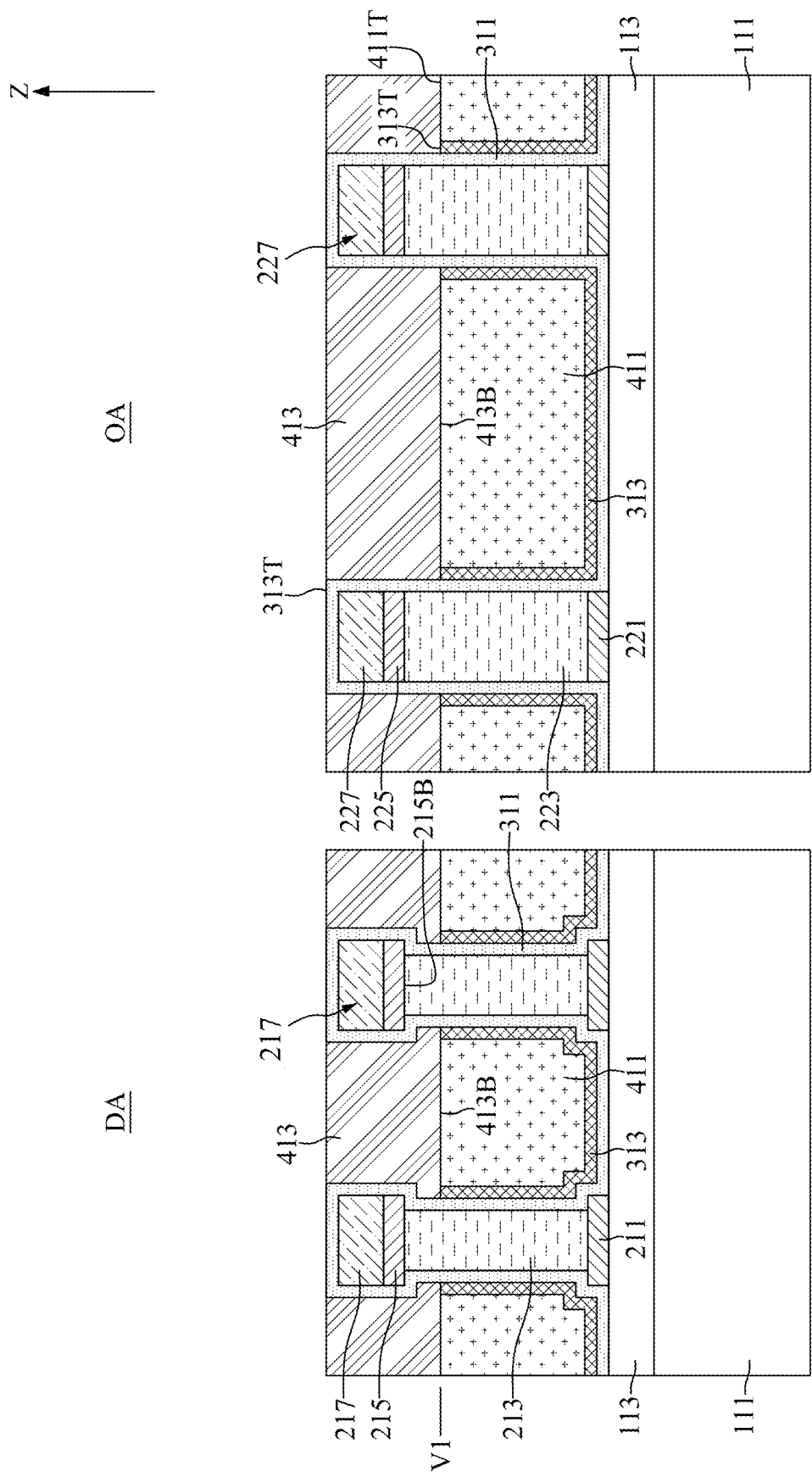

With reference to FIGS. 1, 9, and 10, at step S17, a plurality of top inter-feature dielectric layers 413 may be formed on the plurality of outer liner layers 313 and the plurality of bottom inter-feature dielectric layers 411.

By employing low dielectric material including the plurality of outer liner layers 313 containing vanadium and the porous bottom inter-feature dielectric layers 411, the parasitic capacitance between adjacent first conductive structures 210 or between adjacent second conductive structures 220 may be reduced. As a result, the performance of the semiconductor device 1 may be improved.

With reference to FIG. 9, a layer of first insulating material 533 may be formed to completely cover the plurality of first conductive structures 210, the plurality of second conductive structures 220, the plurality of outer liner layers 313, the plurality of bottom inter-feature dielectric layers 411, and the inner liner layer 311. In some embodiments, the inner liner layer 311 may be, for example, silicon oxide, borophosphosilicate glass, undoped silicate glass, fluorinated silicate glass, silicon nitride, silicon oxynitride, silicon nitride oxide, the like, or a combination thereof. In some embodiments, the layer of first insulating material 533 may be formed by a deposition process including, for example, chemical vapor deposition, plasma enhanced chemical vapor deposition, spin-on coating, or other applicable deposition process.

With reference to FIG. 10, a planarization process, such as chemical mechanical polishing, may be performed until the top surface 311T of the inner liner layer 311 is exposed to remove excess first insulating material 533, provide a substantially flat surface for subsequent processing steps, and concurrently form the plurality of top inter-feature dielectric layers 413. The plurality of top inter-feature dielectric layers 413 may completely cover the plurality of outer liner layers 313 and the plurality of bottom inter-feature dielectric layers 411. The plurality of top inter-feature dielectric layers 413 may be formed between the plurality of first conductive structures 210, and between the plurality of second conductive structures 220. The bottom surfaces 413B of the plurality of top inter-feature dielectric layers 413 and the top surfaces 313T of the plurality of outer liner layers 313 may have the same vertical level V1.

The plurality of top inter-feature dielectric layers 413 may serve as protecting layers to the porous bottom inter-feature dielectric layers 411. Generally, a plurality of vias (not shown for clarity) may be formed on the plurality of first conductive structures 210 and the plurality of second conductive structures 220 for electrically coupling the plurality of first conductive structures 210 and the plurality of second conductive structures 220 to other conductive features. However, overlay shift may occur during the formation of the vias. In such situation, the porous bottom inter-feature dielectric layers 411 may be exposed. Metal ions in the vias may diffuse to the porous bottom inter-feature dielectric layers 411 which may induce short between adjacent first conductive structures 210 or adjacent second conductive structures 220.

In contrast, by employing the plurality of top inter-feature dielectric layers 413, even if an overlay shift occurred during the formation of the vias, metal ion leakage of the vias may be avoided. As a result, the process window of fabricating the semiconductor device 1 may be improved. Accordingly, the yield of fabricating the semiconductor device 1 may be also improved.

Figure 11:
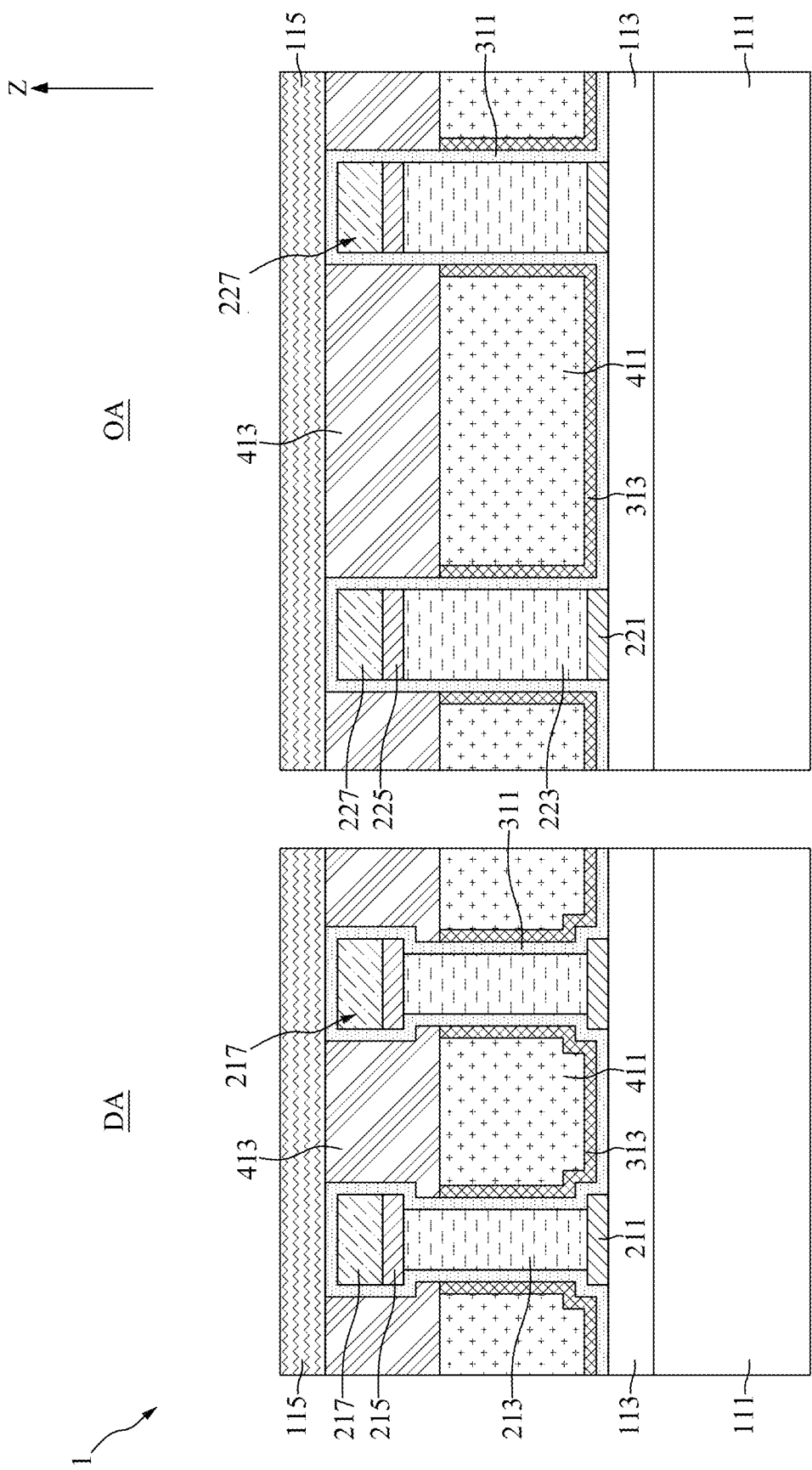

With reference to FIGS. 1 and 11, at step S19, a top dielectric layer 115 may be formed on the plurality of top inter-feature dielectric layers 413.

With reference to FIG. 11, the top dielectric layer 115 may be formed on the plurality of top inter-feature dielectric layers 413 and the inner liner layer 311. In some embodiments, the top dielectric layer 115 may be formed of the same material as the plurality of top inter-feature dielectric layers 413. In some embodiments, the top dielectric layer 115 may be formed of, for example, silicon dioxide, undoped silicate glass, fluorosilicate glass, borophosphosilicate glass, a spin-on low-k dielectric layer, a chemical vapor deposition low-k dielectric layer, or a combination thereof. In some embodiments, the top dielectric layer 115 may include a self-planarizing material such as a spin-on glass or a spin-on low-k dielectric material such as SiLK™. The use of a self-planarizing dielectric material may avoid the need to perform a subsequent planarizing step. In some embodiments, the top dielectric layer 115 may be formed by a deposition process including, for example, chemical vapor deposition, plasma enhanced chemical vapor deposition, spin-on coating, or other applicable deposition process.

One aspect of the present disclosure provides a semiconductor device including a substrate; a plurality of first conductive structures positioned on the substrate; a plurality of outer liner layer positioned on sidewalls of the plurality of first conductive structures; and a plurality of bottom inter-feature dielectric layers positioned on the plurality of outer liner layers and between the plurality of first conductive structures. The plurality of outer liner layers include one or more species of vanadium oxide. The plurality of bottom inter-feature dielectric layers are porous.

Another aspect of the present disclosure provides semiconductor device including a substrate including a dense area and an open area; a plurality of first conductive structures positioned on the dense area; a plurality of second conductive structures positioned on the open area; a plurality of outer liner layer positioned on sidewalls of the plurality of first conductive structures and on sidewalls of the plurality of second conductive structures; and a plurality of bottom inter-feature dielectric layers positioned on the plurality of outer liner layers, between the plurality of first conductive structures, and between the plurality of second conductive structures. A pitch of the plurality of first conductive structures is less than a pitch of the plurality of second conductive structures. The plurality of outer liner layers include one or more species of vanadium oxide. The plurality of bottom inter-feature dielectric layers are porous.

Another aspect of the present disclosure provides a method for fabricating a semiconductor device including providing a substrate including a dense area and an open area; forming a plurality of first conductive structures on the dense area; forming a plurality of second conductive structures on the open area; conformally forming a plurality of outer liner layer on sidewalls of the plurality of first conductive structures and on sidewalls of the plurality of second conductive structures; forming a plurality of bottom inter-feature dielectric layers on the plurality of outer liner layers, between the plurality of first conductive structures, and between the plurality of second conductive structures; and forming a plurality of top inter-feature dielectric layers on the plurality of bottom inter-feature dielectric layers, between the plurality of first conductive structures, and between the plurality of second conductive structures. A pitch of the plurality of first conductive structures is less than a pitch of the plurality of second conductive structures. The plurality of outer liner layers include one or more species of vanadium oxide. The plurality of bottom inter-feature dielectric layers are porous.

Due to the design of the semiconductor device of the present disclosure, the low dielectric constant of the plurality of outer liner layers 313 and the plurality of bottom inter-feature dielectric layers 411 may reduce the parasitic capacitance between adjacent first conductive structures 210 or between adjacent second conductive structures 220. As a result, the performance of the semiconductor device 1 may be improved. In addition, the plurality of top inter-feature dielectric layers 413 may serve as protecting layers to the plurality of bottom inter-feature dielectric layers 411. Therefore, the process window and yield of fabricating the semiconductor device 1 may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
a substrate comprising a dense area and an open area;
a plurality of first conductive structures positioned on the dense area;
a plurality of second conductive structures positioned on the open area;
a plurality of outer liner layers, each positioned on a corresponding sidewall of the plurality of first conductive structures and of the plurality of second conductive structures;
a plurality of bottom inter-feature dielectric layers positioned on the plurality of outer liner layers, between the plurality of first conductive structures, and between the plurality of second conductive structures;
a bottom dielectric layer positioned between the substrate and the plurality of first conductive structures, and between the substrate and the plurality of second conductive structures; and
an inner liner layer positioned between each outer liner layer of the plurality of outer liner layers and a corresponding first conductive structure of the plurality of first conductive structures, and between each other outer liner layer and a corresponding second conductive structure of the plurality of second conductive structures;
wherein a pitch of the plurality of first conductive structures is less than a pitch of the plurality of second conductive structures;
wherein each of the plurality of outer liner layers comprises one or more species of vanadium oxide;
wherein the plurality of bottom inter-feature dielectric layers are porous.

2. The semiconductor device of claim 1, wherein the species of vanadium oxide are according to $VO_x$, wherein x is in between about 1 and about 3.

3. The semiconductor device of claim 1, wherein a dielectric constant of the plurality of outer liner layers is between about 1 and about 3.

4. The semiconductor device of claim 2, wherein each of the plurality of outer liner layers comprises dopants comprising carbon, nitrogen, silicon, boron, or fluorine.

5. The semiconductor device of claim 4, further comprising a plurality of top inter-feature dielectric layers; each top inter-feature dielectric layer positioned on a corresponding one of the plurality of outer liner layers, and between two adjacent first conductive structures or between two adjacent second conductive structures.

6. The semiconductor device of claim 5, further comprising a top dielectric layer positioned on the plurality of top inter-feature dielectric layers.

7. The semiconductor device of claim 1, wherein each first conductive structures respectively comprises:
- a first bottom barrier layer positioned on the bottom dielectric layer;
- a first body portion positioned on the first bottom barrier layer;
- a first top barrier layer positioned on the first body portion; and
- a first dielectric portion positioned on the first top barrier layer.

8. The semiconductor device of claim 7, wherein each second conductive structures respectively comprises:
- a second bottom barrier layer positioned on the bottom dielectric layer;
- a second body portion positioned on the second bottom barrier layer;
- a second top barrier layer positioned on the second body portion; and
- a second dielectric portion positioned on the second top barrier layer.

9. The semiconductor device of claim 8, wherein bottom surfaces of the plurality of top inter-feature dielectric layers are at a vertical level lower than a bottom surface of the first top barrier layer.

10. The semiconductor device of claim 7, wherein a width of the first body portion is less than a width of the first bottom barrier layer.

11. The semiconductor device of claim 8, wherein a width of the second bottom barrier layer and a width of the second body portion are substantially the same.

* * * * *